US011310937B2

(12) United States Patent
Rice et al.

(10) Patent No.: US 11,310,937 B2
(45) Date of Patent: Apr. 19, 2022

(54) IMPINGING JET MANIFOLD FOR CHIP COOLING NEAR EDGE JETS

(71) Applicant: Google LLC, Mountain View, CA (US)

(72) Inventors: Jeremy Rice, Austin, TX (US); Jeffrey Scott Spaulding, Sunnyvale, CA (US); Evan Fraisse, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 29 days.

(21) Appl. No.: 16/887,122

(22) Filed: May 29, 2020

(65) Prior Publication Data
US 2021/0378139 A1  Dec. 2, 2021

(51) Int. Cl.
*H05K 7/20* (2006.01)

(52) U.S. Cl.
CPC ................ *H05K 7/20218* (2013.01)

(58) Field of Classification Search
CPC .......... H05K 7/20218; H05K 7/20254; H05K 7/20772; H05K 7/20436; F28F 13/06; G06F 1/20; G06F 2200/201
See application file for complete search history.

(56) References Cited

U.S. PATENT DOCUMENTS

| | | | | |
|---|---|---|---|---|
| 5,269,372 A * | 12/1993 | Chu | ........................ | F28F 3/12 165/185 |
| 7,114,550 B2 * | 10/2006 | Nakahama | ................ | F28F 3/12 165/80.4 |
| 7,298,618 B2 * | 11/2007 | Campbell | ................ | G06F 1/20 165/80.4 |
| 7,375,962 B2 | 5/2008 | Campbell et al. | | |
| 7,486,514 B2 | 2/2009 | Campbell et al. | | |
| 7,639,030 B2 | 12/2009 | Wadell | | |
| 8,077,460 B1 * | 12/2011 | Dede | ........................ | F28F 3/12 361/699 |
| 8,081,461 B2 | 12/2011 | Campbell et al. | | |
| 8,199,505 B2 | 6/2012 | Dede | | |
| 8,981,556 B2 * | 3/2015 | Joshi | ................... | H01L 23/4735 257/714 |
| 9,131,631 B2 | 9/2015 | Joshi | | |
| 9,247,672 B2 | 1/2016 | Mehring | | |
| 9,252,069 B2 | 2/2016 | Bhunia et al. | | |
| 9,265,176 B2 * | 2/2016 | Arvelo | ................ | H01L 21/4882 |
| 9,484,283 B2 * | 11/2016 | Joshi | ................... | H01L 23/4735 |
| 9,980,415 B2 * | 5/2018 | Zhou | ................. | H05K 7/20927 |
| 10,334,755 B2 * | 6/2019 | Oprins | ............... | H05K 7/20272 |
| 10,561,040 B1 * | 2/2020 | Lunsman | ........... | H05K 7/20272 |
| 10,566,265 B2 | 2/2020 | Fukuoka et al. | | |

(Continued)

OTHER PUBLICATIONS

Extended European Search Report for European Patent Application No. 20211029.2 dated Jun. 1, 2021. 9 pages.

*Primary Examiner* — Abhishek M Rathod
(74) *Attorney, Agent, or Firm* — Lerner, David, Littenberg, Krumholz & Mentlik, LLP; Joseph K. Venier

(57) ABSTRACT

Systems and methods for chip cooling with near edge jets in a direct liquid cooled module are disclosed. One of the functions of a direct liquid cooled module is to provide cooling liquid to components located on a chip. Jet impingement directly onto the back side of a chip is one cooling method that can provide more efficient cooling. An orifice plate includes an array of small diameter holes that correspond to high velocity jet locations and large diameter holes for the insertion of tubes to connect to lower pressure cavities.

17 Claims, 13 Drawing Sheets

(56) References Cited

U.S. PATENT DOCUMENTS

| | | | |
|---|---|---|---|
| 2004/0112571 A1* | 6/2004 | Kenny | F04B 17/00 |
| | | | 165/80.3 |
| 2006/0250773 A1* | 11/2006 | Campbell | H01L 23/4735 |
| | | | 361/699 |
| 2006/0250774 A1* | 11/2006 | Campbell | H01L 23/4735 |
| | | | 361/699 |
| 2006/0266497 A1 | 11/2006 | Berger et al. | |
| 2007/0274045 A1* | 11/2007 | Campbell | F28F 7/00 |
| | | | 361/699 |
| 2008/0264604 A1* | 10/2008 | Campbell | F28F 3/12 |
| | | | 165/80.4 |
| 2012/0170222 A1 | 7/2012 | Dede et al. | |
| 2014/0190668 A1* | 7/2014 | Joshi | H01L 23/427 |
| | | | 165/104.33 |
| 2014/0196498 A1 | 7/2014 | Xiao et al. | |
| 2016/0183409 A1 | 6/2016 | Zhou et al. | |
| 2017/0094837 A1* | 3/2017 | Joshi | H05K 7/20345 |
| 2019/0275794 A1* | 9/2019 | Nishimura | B41J 2/1433 |
| 2019/0343020 A1* | 11/2019 | Todorovic | H05K 9/0022 |

* cited by examiner

IMPINGING JET MANIFOLD FOR CHIP COOLING NEAR EDGE JETS

BACKGROUND

Complementary Metal Oxide Semiconductor ("CMOS") circuits are found in several types of electronic components, including microprocessors, batteries, and digital camera image sensors. The main features of CMOS technology are low static power consumption and high noise immunity.

In addition to industry standard chip packages, special purpose silicon is likely to produce a significant amount of heat in servers. This may be encountered in graphics processing units ("GPUs"), custom application-specific integrated circuits ("ASICs") and high bandwidth memory ("HBM"). Further, services such as imaging and artificial intelligence ("AI") will likely require large compute resources at a high density, with many servers in close proximity to one another. Data centers around the globe are being mandated to simultaneously increase energy efficiency, consolidate operations and reduce costs. To accommodate these high performance and high density servers, data center operators must grapple with not only the increased power densities but also the thermal challenges that they present.

Because liquid is many times better at storing and transferring heat than air, liquid cooling solutions can provide immediate and measurable benefits to compute efficiency, density and performance. The use of direct liquid cooled modules can increase compute performance and density and decrease energy consumption.

Electronic component packages are subject to a wide range of temperature differentials. Due to differences in the thermal coefficient of expansion ("CTE") of the various package components, the electronic component package may warp as the temperature of the electronic component package changes.

BRIEF SUMMARY

To control warpage, direct liquid cooled modules including orifice plates, manifolds and stiffeners may be incorporated into the electronic component package. The direct liquid cooled module is designed with sealing members such that fluid does not leak therefrom. A sealing member, such as an O-ring or gasket, can provide for hermetically sealing a liquid delivery manifold or orifice plate, for example, to the top of a heat dissipating component. The sealing member may reside in a groove located in one of the adjacent components being sealed together. In one example, the presence of a sealing member received in a groove of a heat dissipating component provides a hermetic seal between a manifold device and component substrate, and thereby enables direct liquid cooling of the heat dissipating components by different methods.

The O-ring and/or gasket seal technology enables direct liquid cooling of one or more heat dissipating components such as a microprocessors, memory chips, etc., which enables liquid to come in direct contact with the components. This facilitates cooling by a hermetically attached structure on a chip, for example, with O-ring grooves and sealing.

Jet impingement directly onto the surface of a substrate or semiconductor containing circuitry is one cooling method that can provide efficient cooling. To seal the periphery of a chip with a gasket, for example, it may require coverage of the outer edge of the chip. In one example, this coverage required to seal the periphery is 1-2 mm Since the gasket covers some of the edge, it is preferred to have jet orifices as close to the edge as possible for cooling to occur in that region of the chip. Additionally, the jet orifice may have a substantial pressure drop (potentially exceeding 100 psi) across in order to obtain the jet velocities necessary to provide heat transfer coefficients. This pressure loss creates a need to make the orifice plate thicker, so it doesn't deflect or yield, especially as the area of a chip (and therefore the orifice plate) increases. In one example, the density of a cooling jet array and the diameter of the jet orifices are designed to take into account this pressure loss.

In other examples, the layout, location and number of impinging jets takes into account which chip, for example, multiple ASICs, I/O chips, and memory chips that are integrated into a single package. Some of these chips not only have different heat transfer coefficients, but also have different surface temperature requirements.

One aspect of the disclosure provides an assembly, including an orifice plate having top and bottom surfaces and a plurality of supply and return apertures, the plurality of supply apertures for receiving fluid flowing through the plate from the top surface to the bottom surface, the bottom surface of the orifice plate adapted to be sealed to a top surface of a substrate containing circuitry, a coolant delivery manifold having top and bottom surfaces and at least one supply cavity in fluid communication with at least a subset of the plurality of supply apertures, and at least one return cavity in fluid communication with the plurality of return apertures, and a first sealing member forming a hermetic seal between the top surface of the plate and the bottom surface of the manifold.

The bottom surface of the coolant delivery manifold may have an outer groove, the outer groove forming an outer closed perimeter adapted to receive at least a portion of the first sealing member therein. When the top surface of the plate is sealed to the bottom surface of the coolant delivery manifold all of the plurality of supply and return apertures of the plate are contained within the outer closed perimeter of the outer groove of the coolant delivery manifold. The bottom surface of the manifold may have an inner groove, the inner groove forming an inner closed perimeter at least partially surrounded by the outer closed perimeter and adapted to receive at least a portion of a second sealing member therein. When the top surface of the plate is sealed to the bottom surface of the manifold at least a subset of the plurality of supply and return apertures of the plate are contained within the inner closed perimeter of the inner groove of the manifold.

According to some examples, the assembly further includes a plurality of return tubes directly connecting the at least one return cavity of the manifold with the plurality of return apertures of the plate. Further, a third sealing member may be adapted to create a hermetic seal between the bottom surface of the plate and to the top surface of the substrate. Where the bottom surface of the plate has a groove, the groove forms a closed outer perimeter adapted to receive at least a portion of the third sealing member therein. All of the plurality of supply and return apertures of the plate may be located within the closed outer perimeter of the groove when the plate is sealed to the substrate.

Another aspect of the disclosure provides a coolant delivery manifold, including a top surface including at least one supply cavity and at least one return cavity, and a bottom surface including an inner cavity and a surrounding outer cavity, wherein each of the at least one supply cavities includes an opening between a bottom portion of the supply cavity and at least one of the inner cavity or the surrounding outer cavity on the bottom surface, the opening adapted for transmission of fluid at a first temperature through the supply cavity to the inner cavity and transmission of a fluid at a second temperature different than the first temperature to the surrounding outer cavity, and wherein the at least one return cavity includes a plurality of apertures between the inner cavity on the bottom surface and the top surface, the plurality of apertures sized to receive a plurality of fluid return tubes.

The bottom surface of the manifold may be adapted to be coupled to a top surface of an orifice plate, and wherein a bottom surface of the orifice plate is adapted to be sealed to a top surface of a substrate containing circuitry. The substrate may have first and second circuitry regions, the first circuitry region corresponding to the inner cavity of the coolant delivery manifold, and the second circuitry region corresponding to the outer surrounding cavity of the coolant delivery manifold.

The orifice plate may include a groove including a first closed perimeter and a second closed perimeter, and the orifice plate may be sealed to the substrate such that at least a portion of the first circuitry region is located within the first closed perimeter of the groove and at least a portion of the second circuitry region is located within the second closed perimeter of the groove.

The coolant delivery manifold may further include a plurality of return tubes directly connecting the at least one return cavity of the manifold with a plurality of return apertures in the orifice plate.

Another aspect of the disclosure provides an orifice plate having top and bottom surfaces and a plurality of supply and return apertures, the bottom surface of the plate adapted to seal to a top surface of a semiconductor containing circuitry, the plurality of supply and return apertures in fluid communication with the circuitry when the plate and substrate are sealed together, wherein the bottom surface of the plate has at least one cavity having an internal wall about a perimeter of the cavity, and wherein at least some of the plurality of supply apertures are proximate the internal wall of the at least one cavity. A manifold may be assembled with the orifice place, the manifold having top and bottom surfaces and at least one supply cavity in fluid communication with at least a portion of the plurality of supply apertures and at least one return cavity in fluid communication with the plurality of return apertures. A sealing member may be adapted to create a hermetic seal between the plate and the manifold. Further, a second sealing member may be positioned about the perimeter of the at least one cavity on the bottom surface of the plate, wherein the second sealing member creates a seal between the plate and a substrate including one or more chips.

DETAILED DESCRIPTION

Figure 1:
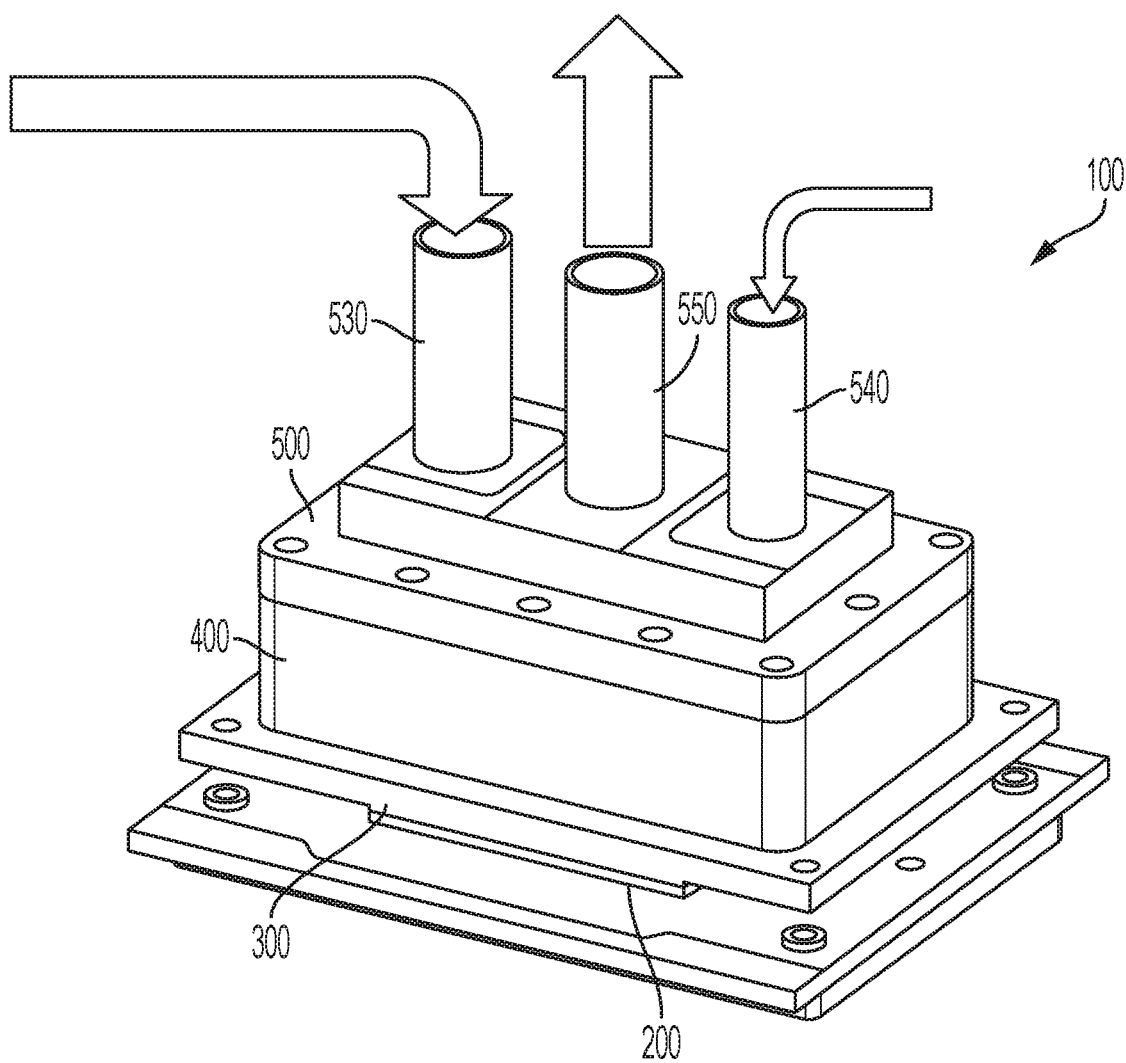
FIG. 1 is a perspective view of one example of a direct liquid cooled module assembly.
Figure 2:
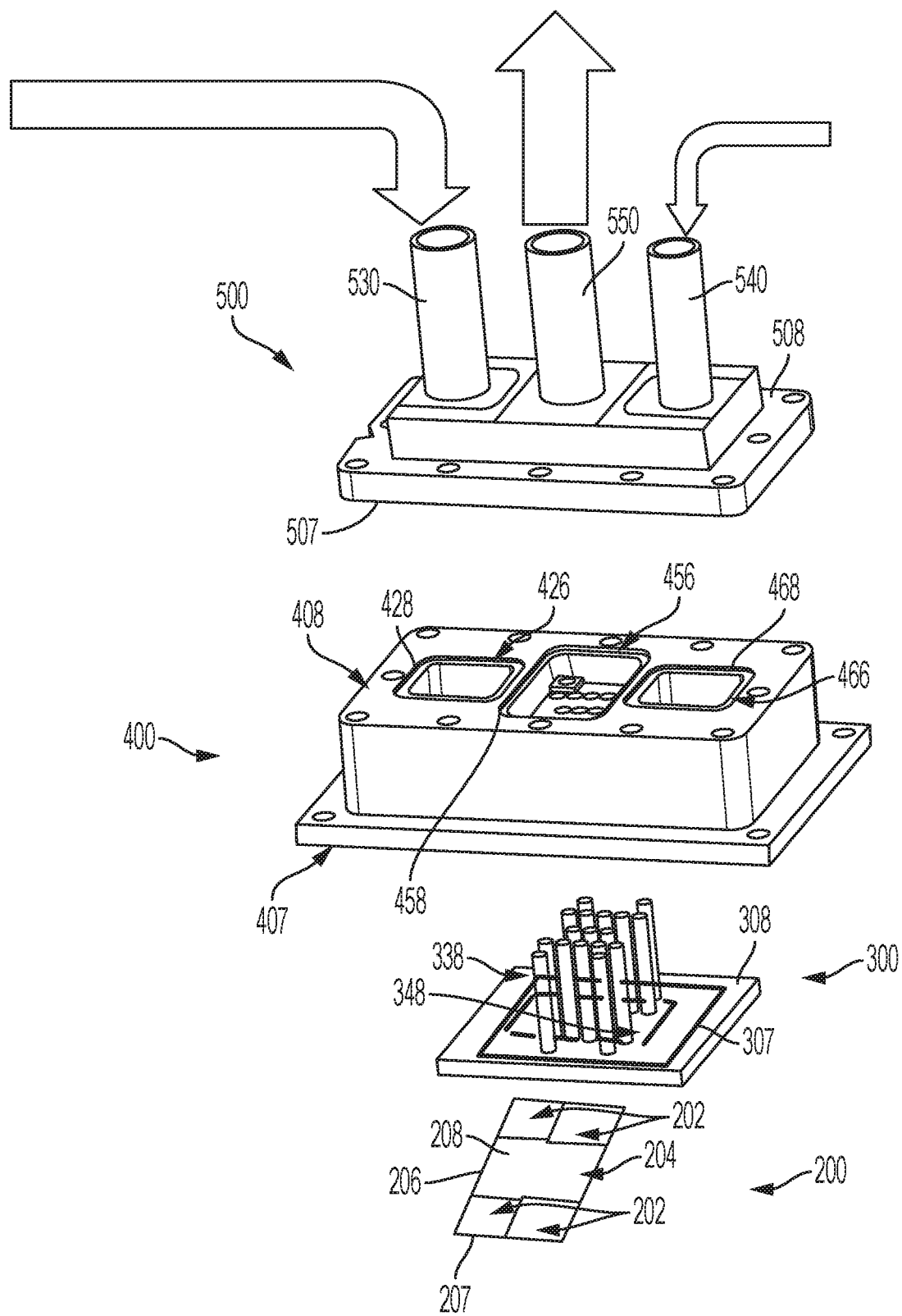
FIG. 2 is an exploded perspective view of the direct liquid cooled module assembly of FIG. 1.

FIGS. 1 and 2 are, respectively, perspective assembled and exploded views of one example of a direct liquid cooled module assembly 100. Assembly 100 includes a chip or chip package 200, an orifice plate 300, a manifold 400 and a top plate 500.

A top perspective view of chip 200 is shown in FIG. 2. Chip 200 includes various processing components. In one example, chip 200 may be bonded to a carrier substrate or substrate. Chip 200 alone and/or bonded to a substrate may be an integrated circuit ("IC") chip, system on chip ("SoC"), or portion thereof, that may include various passive and active microelectronic devices such as resistors, capacitors, inductors, diodes, metal-oxide semiconductor field effect ("MOSFET") transistors, CMOS transistors, bipolar junction transistors ("BJTs"), laterally diffused metal-oxide-silicon ("LDMOS") transistors, high power MOS transistors, other types of transistors, or other types of devices. Chip 200 may comprise a memory device, a logic device, or other types of circuits, as examples. The substrate that chip 200 may be bonded to can be, for example, a silicon substrate, a plastic substrate, a flexible substrate having polyimide and copper layers for example, a laminate substrate, a ceramic substrate, an interposer, or any other suitable support structure.

In the example shown, the processing components of chip 200 are HBMs 202 and an ASIC 204. In the present example, there are four HBMs 202 and one central ASIC 204. A portion of the perimeter of each of the HBMs 202 and ASIC 204 together form a chip periphery or perimeter 206. The processing components of chip 200 are located on a top surface 208 of chip 200. Each HBM 202 lies adjacent another HBM 202 and a portion of ASIC 204. In other examples, chip 200 can include more or less HBMs and ASICs and can be located on chip 200 in other configurations. Perimeter 206 can be a top surface 208 of a substrate that chip 200 is bonded to or perimeter 206 can be the top surface 208 of chip 200 itself. In one example, perimeter 206 can be the perimeter of both bottom surface 207 and top surface 208 of chip 200. Any portion of top surface 208 that is not enclosed by perimeter 206 may be referred to as "dead space" on chip 200 and/or the substrate that chip 200 is bonded to in that there are no processing components located in the portion of top surface 208. Because there are no processing components located in this area, this area is preferable for loading of other direct liquid cooled module system components and using this area as a base for applying sealing features, for example. A direct liquid cooled module generally functions to bring coolant to the components of the chip. The module is generally hermetically sealed so that the coolant may only be expelled from the system through an outlet. If coolant is supposed to be introduced to components of the chip to provide a cooling effect, it is generally not preferable to apply a seal directly on the components such that the coolant cannot directly access the components. The perimeter 206 is therefore a preferred location on top surface 208 to provide a seal such that coolant can be directly applied to the components of the chip.

While FIG. 1 shows assembly 100, chip 200 and orifice plate 300 cannot be seen in this assembled view. When viewing the orientation of the assembly components in exploded FIG. 2, it can be understood that when assembled together, top surface 208 of chip 200 is sealed to a bottom surface 307 of orifice plate 300, top surface 308 of orifice plate 300 is sealed to a bottom surface 407 of manifold 400, and a top surface 408 of manifold 400 is sealed to a bottom surface 507 of top plate 500. When top surface 308 of orifice plate 300 is sealed to a bottom surface 407 of manifold 400, the locations on top surface 308 of orifice plate 300 where there is sealing is represented by outer seal perimeter 338 and inner seal perimeter 348. When bottom surface 507 of orifice plate 300 is sealed to a top surface 408 of manifold 400, the locations on top surface 408 of manifold 400 where there is sealing is represented by perimeter seals 426, 456, 466. Also shown generally in FIGS. 1 and 2 are three arrows that represent the direction of fluid entering into respective inlets 530 and 540 and outlet 550 of top plate 500. The flow of liquid through assembly 100 will be discussed in greater detail below.

Figure 3A:
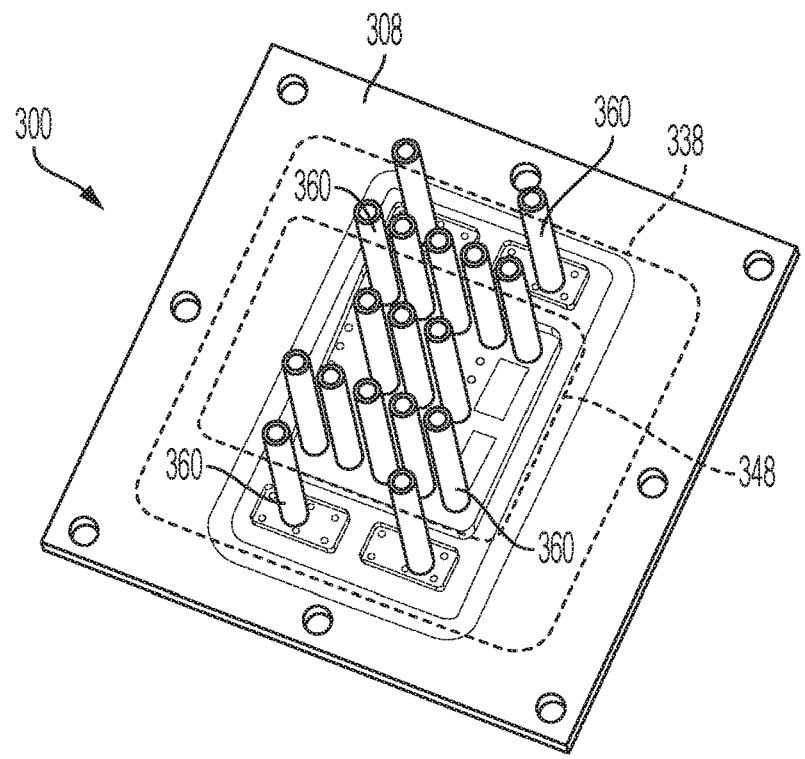
FIG. 3A is a top perspective view of one example of an orifice plate.
Figure 3B:
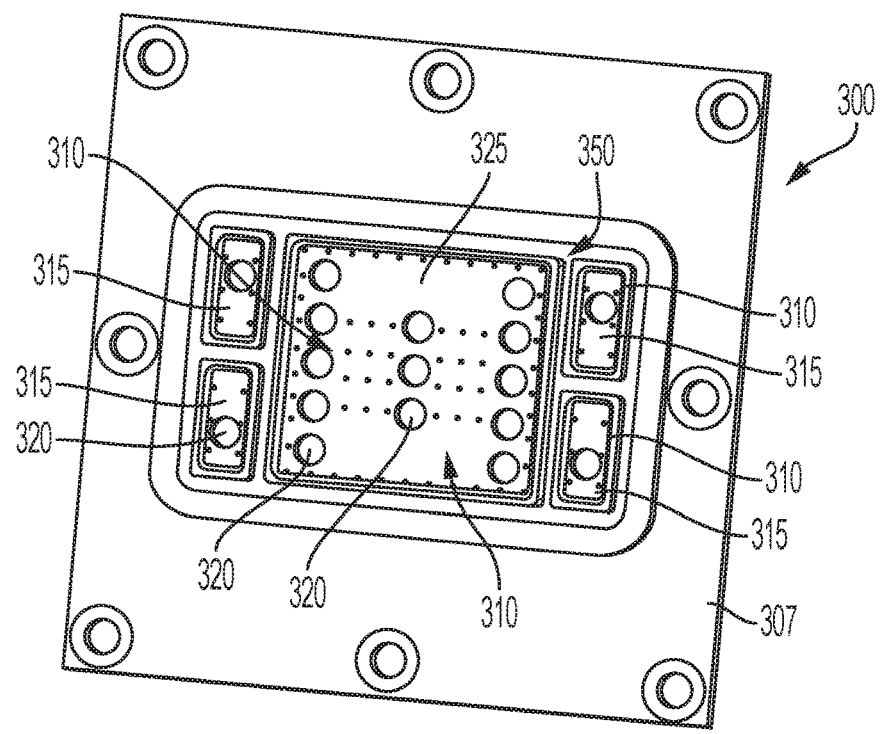
FIG. 3B is a bottom perspective view of the orifice plate of FIG. 3A.

FIGS. 3A and 3B are respective top and bottom perspective views of one example of orifice plate 300 of assembly 100 shown in FIG. 2. Orifice plate 300 has a perimeter or periphery 306, a bottom surface 307 and a top surface 308. Orifice plate 300 includes a plurality of supply apertures 310 and return apertures 320 that extend through orifice plate 300. Each of supply apertures 310 and return apertures 320 extend from top surface 308 of orifice plate 300 and into respective cavities 315 and 325 in bottom surface 307 of orifice plate 300. As shown in FIG. 3B, cavities 315 are located in the areas above HBMs 202 and cavity 325 will be in the area above ASIC 204 when chip 20 and orifice plate 300 are sealed together. A plurality of supply apertures 310 and at least one return aperture leads into each cavity 315. Several supply apertures 310 and return apertures 320 are located within cavity 325. In other examples, there may be more or less supply and return apertures 310, 320 located within cavities 315, 325.

The plurality of supply apertures 310 are for receiving fluid flowing from manifold 400 to the top surface 308 of orifice plate 300. These supply apertures 310 may also be referred to as impinging jets. The supply apertures 310 are an array of small diameter holes placed in particular locations through orifice plate 300. A relatively high pressure differential, for example from 5 to greater than 100 psi is applied across the top surface 308 of orifice plate 300. This creates high velocity water jets through the small diameter holes or supply apertures 310. In one example, these jets impinge on a top surface 208 of chip 200 creating a high heat transfer coefficient.

In one example, orifice plate 300 can cool a total chip area of approximately 20-30 mm×30-50 mm In other examples, orifice plate 300 can be designed to cool a total chip area greater or less than 20-30 mm×30-55 mm. The bottom surface 307 of orifice plate 300 includes a groove 340 (shown for example in FIG. 7) for receipt of an O-ring or gasket 350. Groove 340 is designed such that at least a portion of a portion of O-ring or gasket 350 is received within the groove 340. When bottom surface 307 of orifice plate 300 comes into direct contact with top surface 208 of chip 200, O-ring or gasket 350 makes a hermetic seal between chip 200 and orifice plate 300.

As shown in FIG. 3B, gasket 350 forms a window pane arrangement to create a hermetic seal between chip components, namely HBMs 202 and ASIC 204. These components may be bonded to chip 200 with an epoxy type material that is not generally compatible with water and therefore the window pane arrangement of gasket 350 forms a protective seal around the respective perimeters of these components.

The array of small diameter holes or supply apertures 310 correspond to high velocity jet locations. In one example, the high velocity jets are created from the pressure differential between the high pressure cavities 455, 465 of manifold, shown in FIG. 6A for example, and low pressure cavities 315, 325, shown in FIG. 3B, between chip 200 and orifice plate 300. In one example, the small holes 310 can be spaced between 0.5 & 2 mm over high power density regions of the chip 200 and 2 mm to 5 mm over the regions of chip 200 with lower power density. In one example, the diameter of holes 310 is between approximately 50 to 300 microns. In other example, the diameter of holes 310 may be smaller than 50 micron or larger than 300 micron.

Figure 6A:
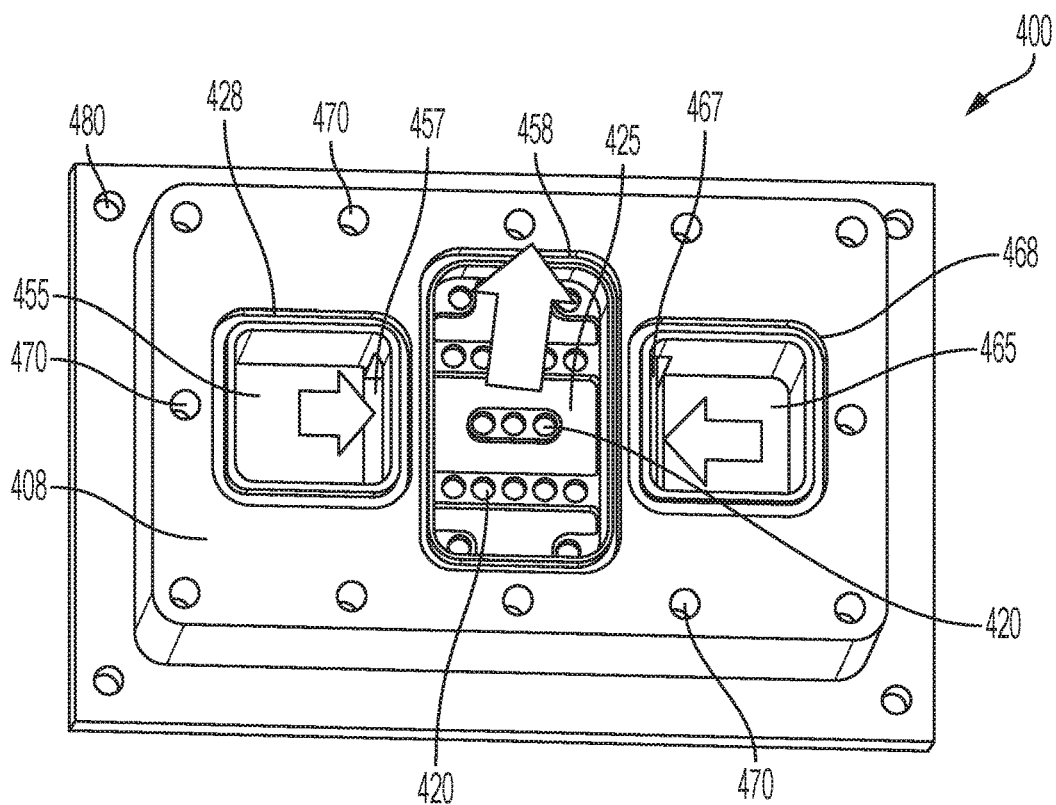
FIG. 6A is a top perspective view of one example of a manifold of the assembly shown in FIG. 1.

Orifice plate 300 includes larger diameter holes or a plurality of return apertures 320, into which return tubes 360 may be inserted to connect cavities 315, 325 of orifice plate 300 and lower pressure return reservoir 425 of manifold 400, shown in FIG. 6A for example. In one example, the diameter of holes 320 can be from 500 micron to 4 mm in diameter. In other examples, the diameter of holes 320 may be smaller than 500 micron or larger than 4 mm Generally, holes 320 are separated from the edge of each cavity 315, 325 by at least one row of small diameter holes 310.

Placement of the large diameter holes 320 is designed based on the longitudinal distance from orifice plate 300 to top surface 208 of chip 200, which is approximately 500 micron to 2 mm. Since this clearance is low, bulk fluid flow may interact with the jets or small diameter holes 310 and impede the fluid velocity that interacts with top surface 208 of chip, which may lead to a decrease in the heat transfer coefficient.

Figure 4:
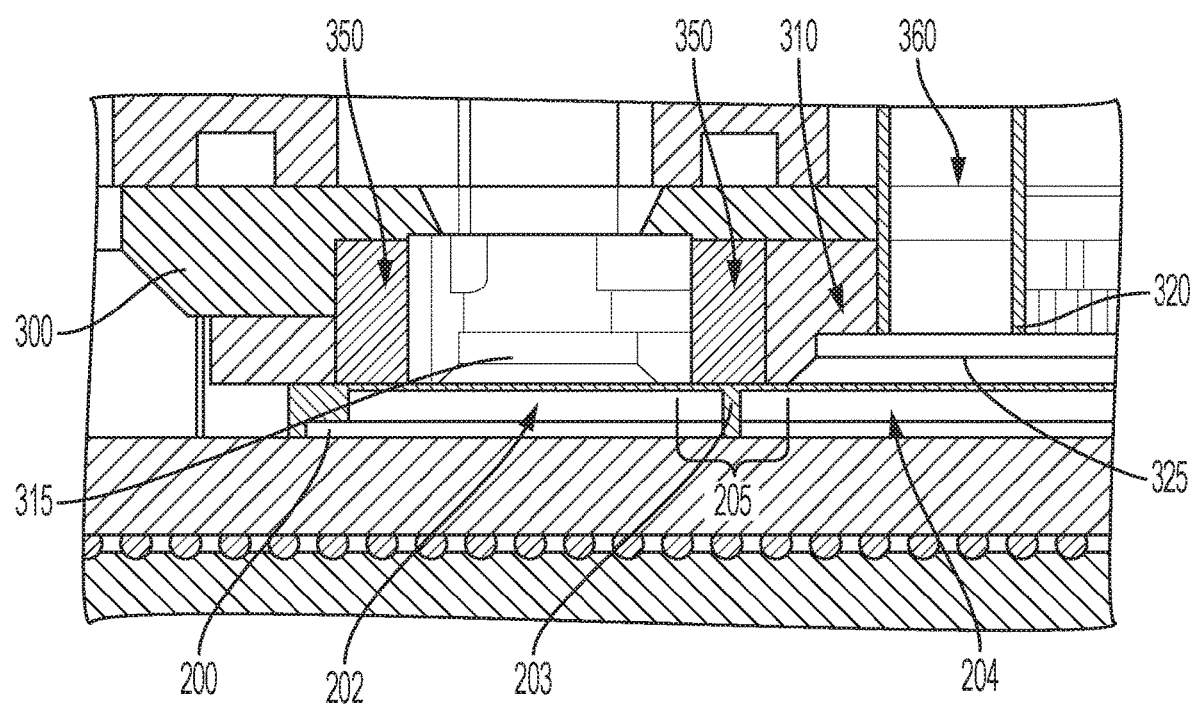
FIG. 4 is a cross-sectional view of one example of an orifice plate coupled to a chip package.

FIG. 4 is a cross-sectional view of one example of an orifice plate 300 coupled to a chip package 200. Gasket 350 is shown within groove 340 of orifice plate. In this example, gasket 350 is shown covering an edge of an HBM 202 and edge of an ASIC 204 and an overmold 203 located between HBM 202 and ASIC 204. An area 205 is shown encompassing the edge of an HBM 202, edge of an ASIC 204 and overmold 203. An example of an edge jet or supply aperture 310 is shown near an edge of ASIC 204. Other supply apertures 310 are shown in a more central portion of both HBM 202 and ASIC 204. Also shown are return tubes 360 each within a large hole or return aperture 320. Each return tube 360 lies adjacent one of low pressure cavities 315, 325 such that fluid which enters the respective cavities 315, 325 through a supply aperture 310 exits the cavities 315, 325 through one of return tubes 360.

Figure 5:
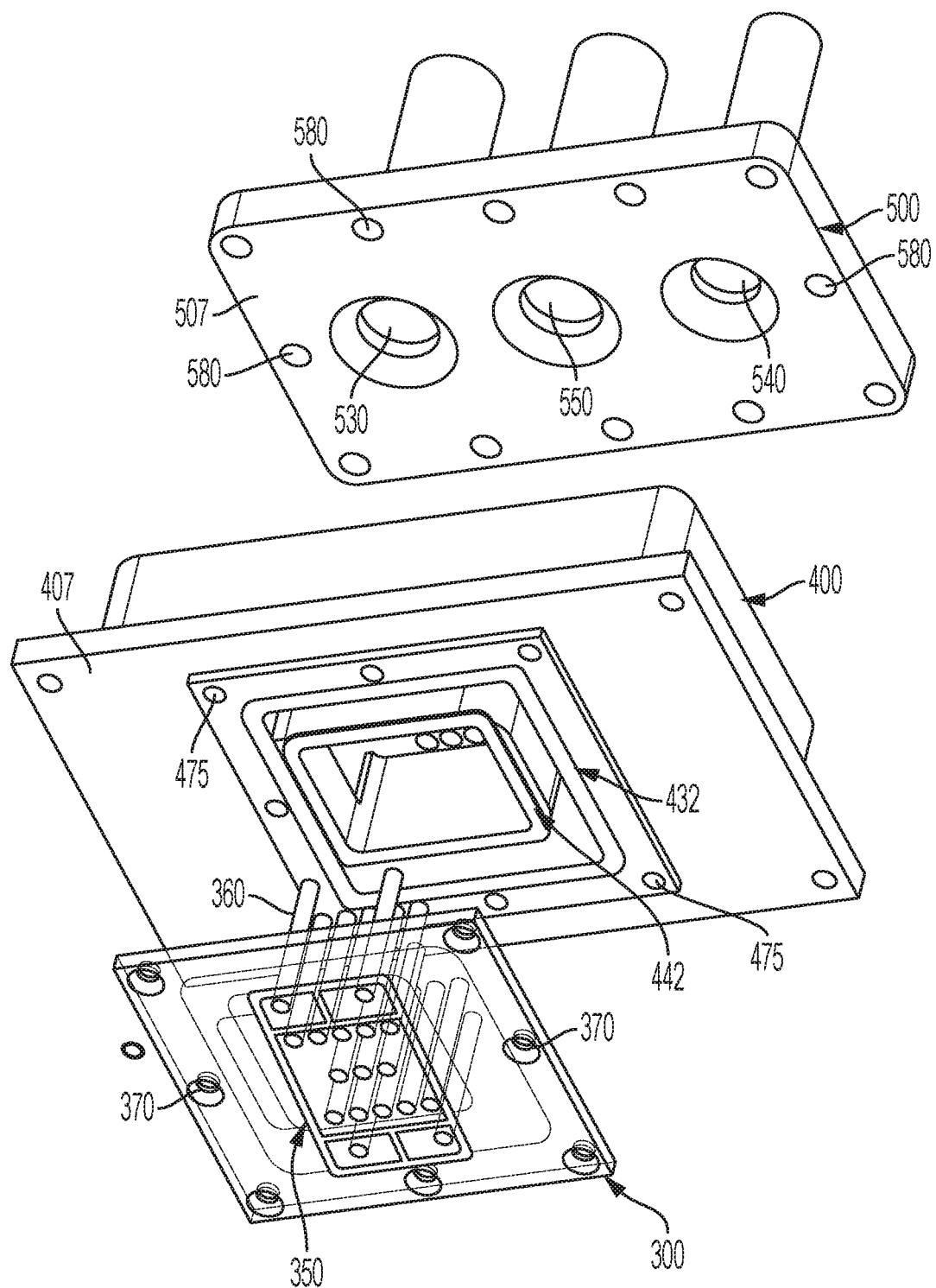
FIG. 5 is an exploded bottom perspective view of a top plate, a manifold and an orifice plate of the direct liquid module assembly of FIG. 1

FIG. 5 is an exploded bottom perspective view of a top plate 500, a manifold 400 and an orifice plate 300 of the direct liquid module assembly 100 of FIG. 1. In this figure, it is seen how orifice plate 300 lines up with manifold 400. Orifice plate 300 is shown with eight peripheral apertures 370 that line up with corresponding eight recesses 475 in bottom surface 407 of manifold 400. Fasteners (not shown) can be inserted through each aperture 370 in orifice plate 300 and into a corresponding recess 475 of manifold 400 to aid in the securing of orifice plate 300 and manifold 400.

In FIG. 5, orifice plate 300 has some transparency that you can see some of the return tubes 360 while viewing the bottom surface of orifice plate 300. FIG. 3A shows each return tube 360 coupled to each return aperture 320 of orifice plate 300. In this example, there is one return tube 360 corresponding to each location of four HBMs 202 and there are thirteen return tubes 360 corresponding to the location of ASIC 204. The four return tubes 360 located in the HBM 202 locations are received in an outer cavity 435 of manifold 400 while the thirteen return tubes 360 located in the ASIC 204 location are received in an inner cavity 445 of manifold 400 when orifice plate 300 is sealed to manifold 400. Also shown in FIG. 5 is a bottom surface 507 of top plate 500. Where fluid exits inlets 530 and 540 and is received within outlet 550 of top plate 500 can also be seen by viewing bottom surface 507 of top plate 500. There are twelve peripheral apertures 580 that line up with corresponding recesses 470 (shown in FIG. 6A) in top surface 408 of manifold 400. Fasteners (not shown) can be inserted through each aperture 580 in top plate 500 and into a corresponding recess 470 of manifold 400 to aid in the securing of top plate 500 and manifold 400. Manifold 400 also includes four peripheral apertures 480 in which fasteners (not shown) can be inserted to aid in the securing of manifold to other components of the direct liquid cooled module such as a bolster plate 600, for example, shown in FIG. 8.

Figure 6B:
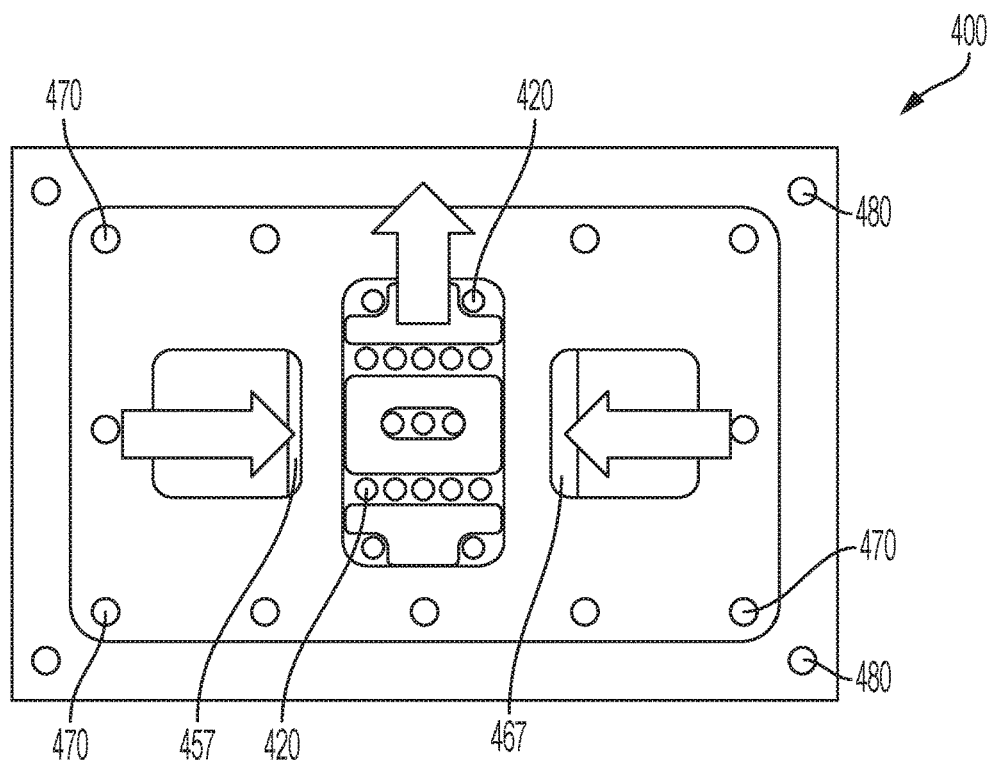
FIG. 6B is a top plan view of the manifold of FIG. 6A.
Figure 6C:
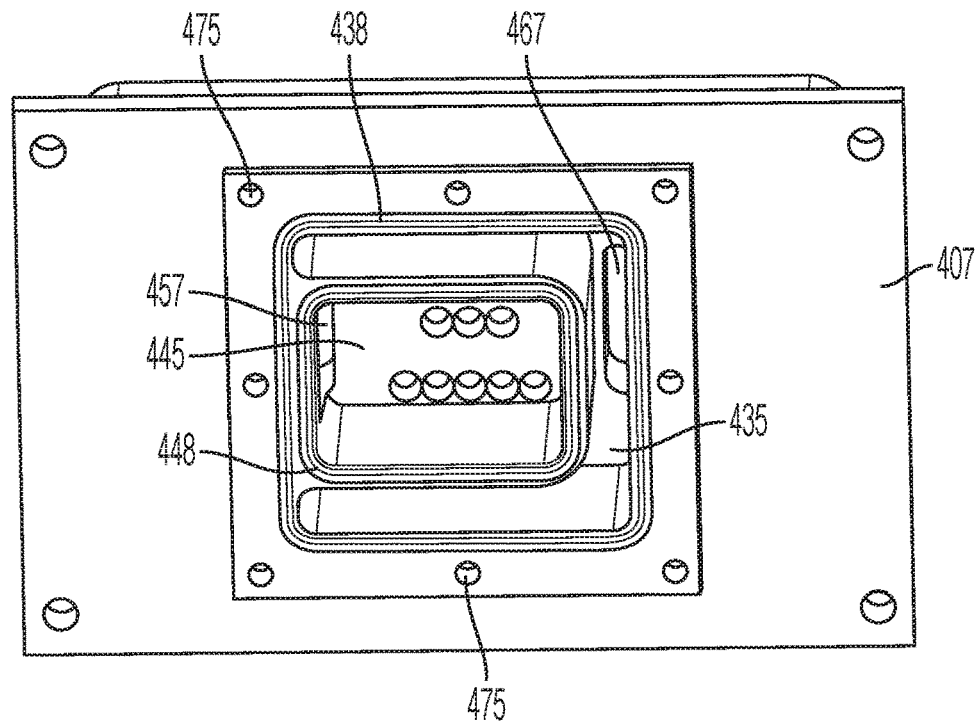
FIG. 6C is a bottom perspective view of the manifold of FIG. 6A.
Figure 6D:
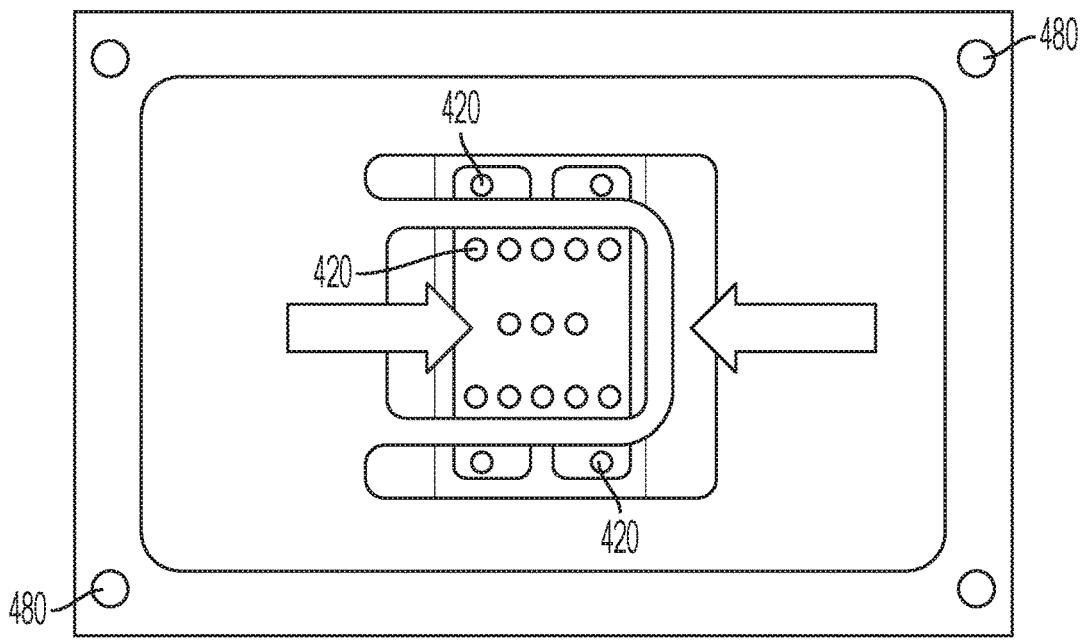
FIG. 6D is a bottom plan view of the manifold of FIG. 6A.

FIGS. 6A-6D are various views of one example of a manifold 400 of the assembly 100 shown in FIG. 1. As shown in FIGS. 6A and 6B, manifold 400 includes low pressure return reservoir 425 between a first high pressure supply reservoir 455 and a second high pressure supply reservoir 465. Reservoir 455 includes an elongate opening 457 and reservoir 465 includes an elongate opening 468. An arrow in reservoir 455 shows the direction of fluid flow from reservoir 455 through opening 457 while an arrow in reservoir 465 shows the direction of fluid from reservoir 465 through opening 468. Fluid flowing through opening 457 from reservoir 455 enters into inner cavity 445 while fluid flowing through opening 468 from reservoir 465 enters into outer cavity 435. Fluid then flows from inner cavity 445 onto top surface 308 of orifice plate 300 and through supply apertures 310 and into cavity 325 leading to ASIC 204 of chip 200. Fluid also then flows from outer cavity 435 onto top surface 308 of orifice plate 300 and through supply apertures 310 and into cavities 315 leading to HBMs 202 of chip 200. All fluid in cavities 315, 325 then enters a first end of respective return tubes 360 and exits a second end of return tubes coupled to return apertures 420 into low pressure return reservoir 425 of manifold 400.

Surrounding outer cavity 435 and inner cavity 445 are respective grooves 438 and 448 in bottom surface 407 of manifold 400. An O-ring or gasket 432 is at least partially received within groove 438 of outer cavity 435 and an O-ring or gasket 442 is at least partially received within groove 448 of inner cavity 445. When bottom surface 407 of manifold is sealed to top surface 308 of orifice plate 300, all return tubes 360 are contained within the perimeter of groove 438 and the four outer return tubes 460 are contained within outer cavity 435, while the thirteen inner return tubes 460 are contained both within the perimeter of groove 448 and inner cavity 445.

Surrounding each of low pressure return reservoir 425, first high pressure supply reservoir 455, and second high pressure supply reservoir 465 are respective grooves 428, 458 and 468. An O-ring or gasket 422, 452 and 462 is at least partially received within respective grooves 428, 458 and 468 as shown for example in FIG. 2. When bottom surface 507 of top plate 500 is in direct contact with top surface 408 of manifold, each of O-ring or gasket 422, 452 and 462 are in direction contact with bottom surface 507 of top plate 500 to hermetically seal the respective low pressure return reservoir 425, first high pressure supply reservoir 455, and second high pressure supply reservoir 465.

While grooves 428, 438, 448, 458 and 468 are shown with a rectangular shape, in other examples, one or more of these grooves can take the form of shapes other than rectangular, such as square, ovular, or circular, for example. In the present examples, grooves 428, 438, 448, 458 and 468 are continuous in that each does not have any spaces or gaps about their respective perimeters, including at any corner thereof. In other examples, these grooves may have one or more spaces or gaps about their respective perimeter.

Figure 7:
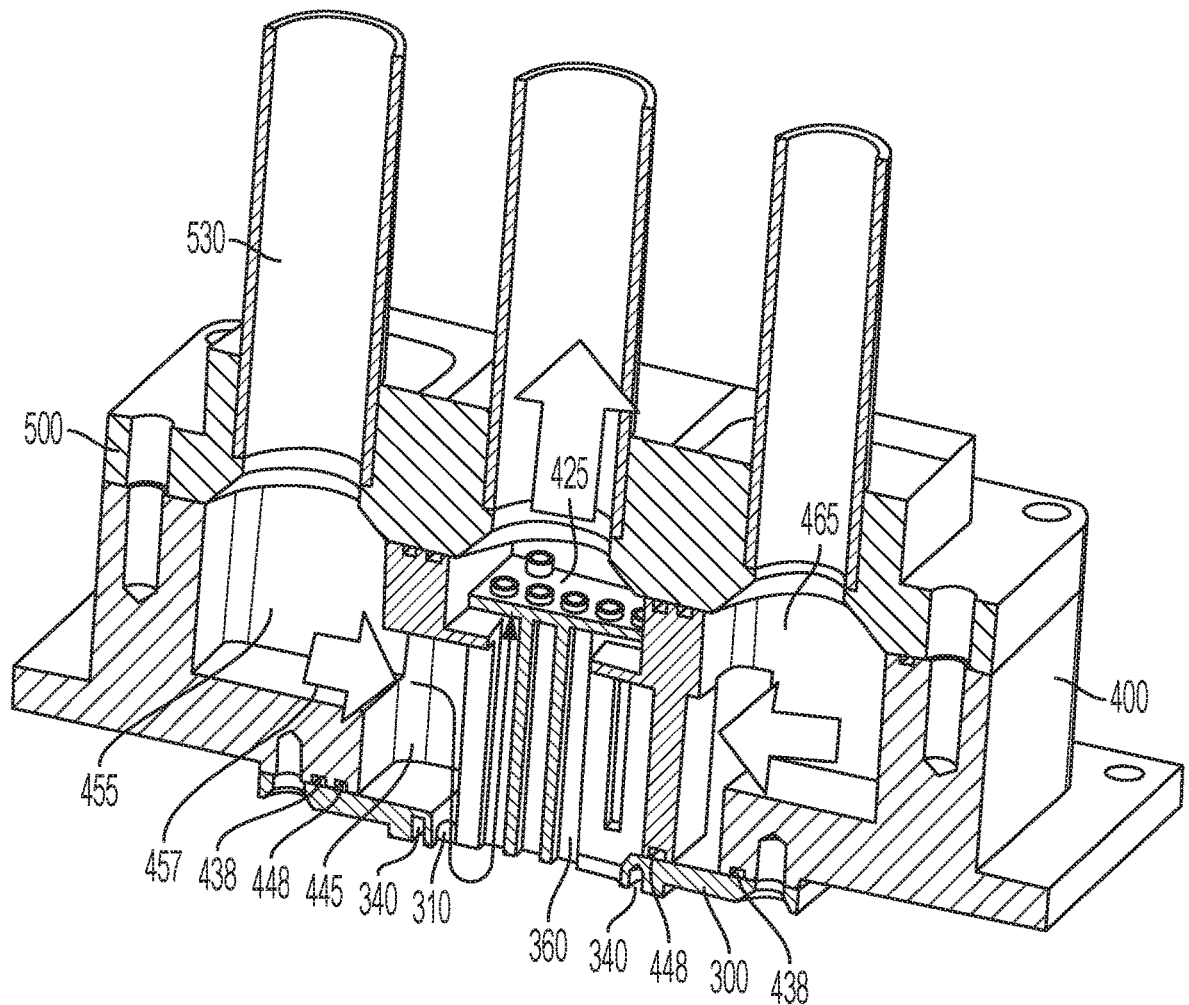
FIG. 7 is a cross-sectional perspective assembled view of the top plate, manifold and orifice plate of FIG. 5.
Figure 8:
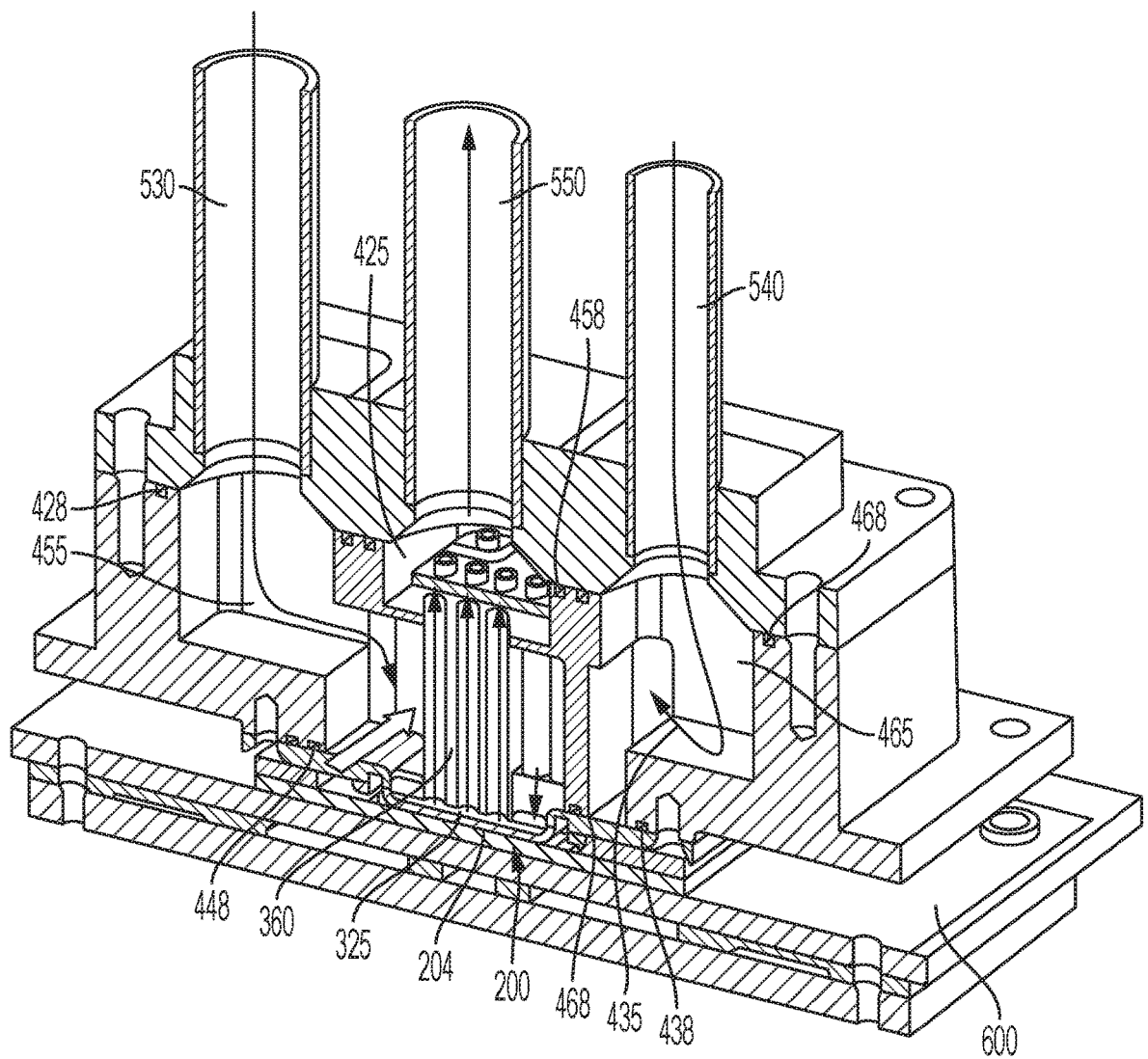
FIG. 8 is a cross-sectional perspective view of the direct liquid cooled module assembly of FIG. 1.

FIG. 7 is a cross-sectional perspective assembled view of orifice plate 300, manifold 400 and top plate 500 while FIG. 8 is a cross-sectional assembled view of each of these system components including additional components of the system such as chip 200, and a bolster plate 600. In FIG. 7, a curved arrow shows an example fluid path of fluid that entered the system through inlet 530 of top plate 500 and into reservoir 455. From reservoir 455 the fluid flows through opening 457 of reservoir 455 and into inner cavity 445 before flowing through supply apertures 310 of orifice plate 300. Once through orifice plate 300, the fluid enters into cavity 325 and then onto the surface of ASIC 204 of chip 200, which is shown in FIG. 8. Fluid within cavity 325 then enters the return tubes 360 located within the perimeter of cavity 325 of orifice plate 300 and exits into low pressure return reservoir 425 of manifold 400 before then flowing out of outlet 550 of top plate 500.

Also shown in FIGS. 7 and 8 is an example fluid path of fluid that entered the system through inlet 540 of top plate 500 and into reservoir 465. From reservoir 465 the fluid flows through opening 468 of reservoir 465 and into outer cavity 435 before flowing through supply apertures 310 of orifice plate 300. Once through orifice plate 300, the fluid enters into cavities 315 of orifice plate 300 and then onto the surface of HBMs 202 of chip 200, which is shown in FIG. 8. Fluid within cavities 315 then enters the return tubes 360 located within the perimeters of cavities 315 and exits into low pressure return reservoir 425 of manifold 400 before then flowing out of outlet 550 of top plate 500.

This system includes two supply lines and a common return line. The main supply line, which may be referred to as inlet 530 directs approximately 80-95% of the fluid flow to a component of chip 200 such as ASIC 204, for example. The components of chip 200 that are fed fluid from the main supply line generally consume most of the power of chip 200. A second supply line, which may be referred to an inlet 540 directs approximately 5-20% of the fluid flow to other components of chip 200 such as one or more HBMs 202. An HBM 202 is generally more sensitive to temperature and may require lower temperature fluid than an ASIC 204, for example. Since the percentage of flow is less in the second supply line, it can be more cost effective to deliver a colder supply of water through the second supply line than to provide that lower temperature water to the entire package assembly 100, including for example, both HBMs 202 and one or more ASICs 204. There is a common return, which may be referred to as outlet 550 where the fluid flow mixes from all components of chip 200 such as HBMs 202 and ASIC 204.

In other examples, system 100 can have other configurations. System 100 can have a single supply line and a single return, instead of the previously described example of system 100 have two supply lines and a single return. In another example, system 100 can have two supply lines and two returns. In other examples, system 100 can have one or two supply lines and more than two returns. In other examples, system 100 can have one or two returns and more than two supply lines. In yet other examples, system 100 can have more than two supply lines and more than two returns.

In other examples, chip 200 can have various other configurations of components, such as one or more HBMs, ASICs and chiplets. In other examples, O-rings and gaskets used to create hermetic seals between chip 200 and orifice plate 300, orifice plate 300 and manifold 400, and manifold 400 and top plate 500 could be located only around the respective perimeters of each of the features of system 100. In such a case, the mold material used to bond components to chip 200 may be allowed to be wetted instead of covered by an O-ring or gasket as shown, for example, in FIG. 4. In another example, a window gasket may be used if there are two supply lines and two returns and one pair of supply lines and returns operates with colder fluid and the other pair of supply lines and returns operates with warmer fluid.

Figure 9A:
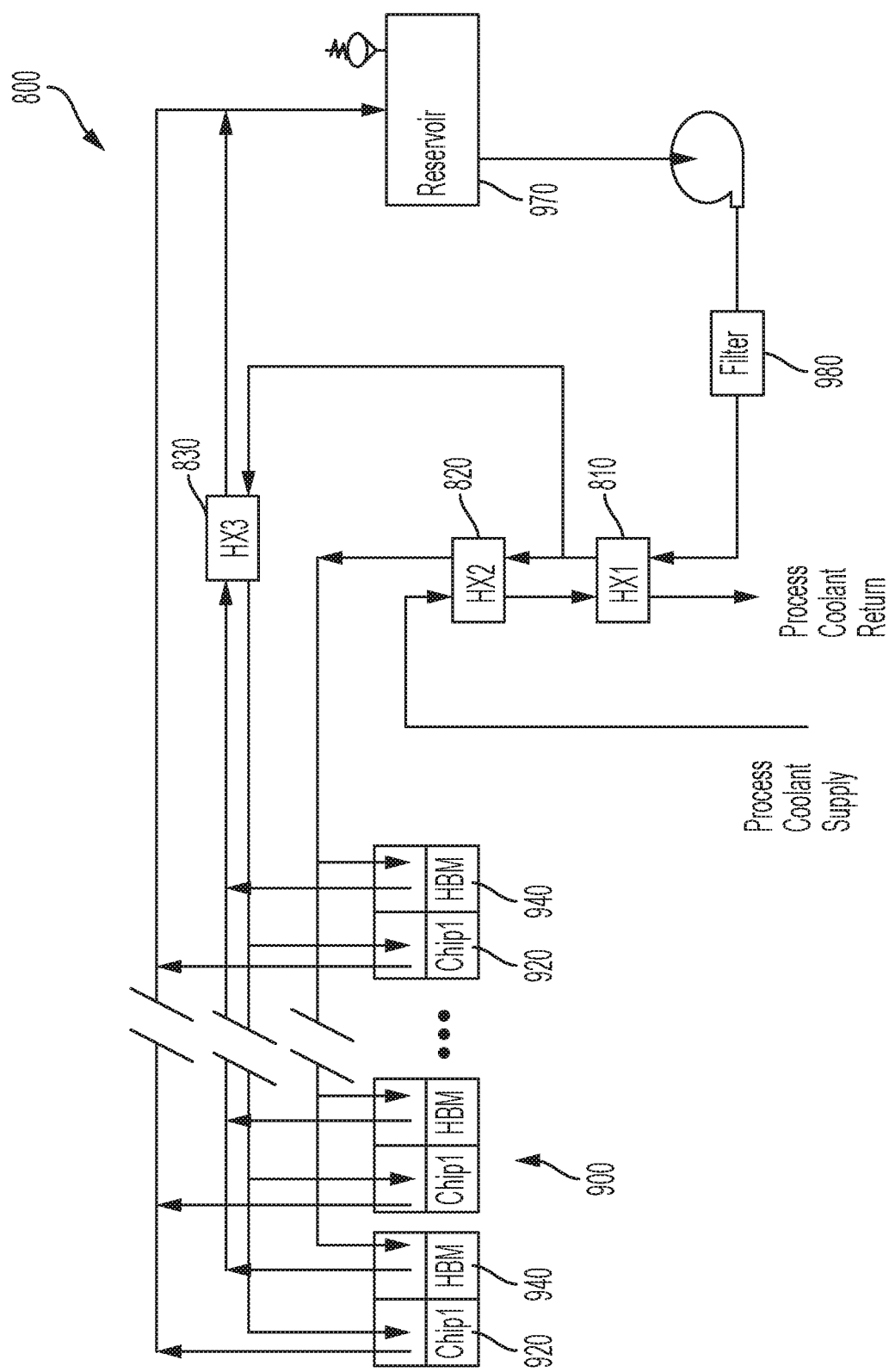
FIG. 9A is a schematic flow diagram of one example of a fluid delivery system to one or more assemblies of FIG. 1.

FIG. 9A is a schematic flow diagram of one example of a fluid delivery system 800 to one or more chip packages 900. Each chip package has at least one first chip component 920 and a second chip component 940. In one example, first chip component 920 is one or more ASICs and second chip component 940 is one or more HBMs. However, it should be understood that the chip components may include any combination of a variety of chips, such as GPUs, ASICs, etc., in any number or configuration. Coolant in the form of fluid is supplied to system 800 from a lab chiller, for example. In one example, coolant supplied to system 800 is 16° C. The coolant then enters a second heat exchange 820 and mixes with higher temperature coolant supplied from a first heat exchange 810. Fluid either exits heat exchange 820 to travel to a second chip component 940 or travels to first heat exchange 810. In one example, approximately 10% of the coolant that is supplied to system 800 exits heat exchange 810 to travel to second chip component 940. In this example, the coolant that travels to second chip component 940 is 17° C. While in other examples, the coolant supplied to system 800 can be more or less than 16° C. and the coolant supplied to second chip component 940 can be more or less than 17° C., there is generally a low temperature differential between the coolant supplied to system 800 and the coolant supplied to second chip component 940. It should be understood that the foregoing is merely an example, and that the percentage of coolant from heat exchange 810 supplied to the second chip component 940 may be varied, and the temperature of the coolant supplied to each component may be varied.

The coolant that enters first heat exchange 810 from second heat exchange 820 mixes with fluid that is returned from previously cooling of first chip component 920. In one example, the fluid returned from previous cooling of both first and second chip components 920, 940 enters first heat exchange 810 at approximately 35° C. In this example, the coolant that enters first heat exchange 810 either exits first heat exchange 810 to a coolant return at approximately 32° C. or exits first heat exchange 810 at approximately 34.5° C. before flowing to a third heat exchange 830. Approximately 90% of the fluid flow in system 800 flows to first chip component 920. There is a very low temperature differential (approximately 0.5° C.) between the fluid returned from previous cooling and the fluid that travels to the third heat exchange 830. In other examples, the coolant that exits first heat exchange 810 to a coolant return can be more or less than 32° C., the coolant that exits first heat exchange 810 before flowing to a third heat exchange 830 can be more or less than 34.5° C., and the fluid or coolant returned from previous cooling of both first and second chip components 920, 940 enters first heat exchange 810 at more or less than 35° C. As mentioned above, such values for the percentage of fluid flow and temperatures of coolant are merely examples and may be varied.

As further shown in FIG. 9A, third heat exchange 830 exchanges heat with fluid flowing first chip component 920 with fluid returning from cooling second chip component 940. Here, warmer fluid flowing to first chip component 920 or ASICs mixes with cooler fluid returning from second chip component 940 or HBMs. Fluid exiting first chip component 920 then travels to a reservoir 970 and then to a filter 980 before entering first heat exchange 810. Fluid exiting third heat exchange 830 mixes with fluid that has exiting first chip component 920 before entering reservoir 970 and together flowing to filter 980 before entering first heat exchange 810.

Figure 9B:
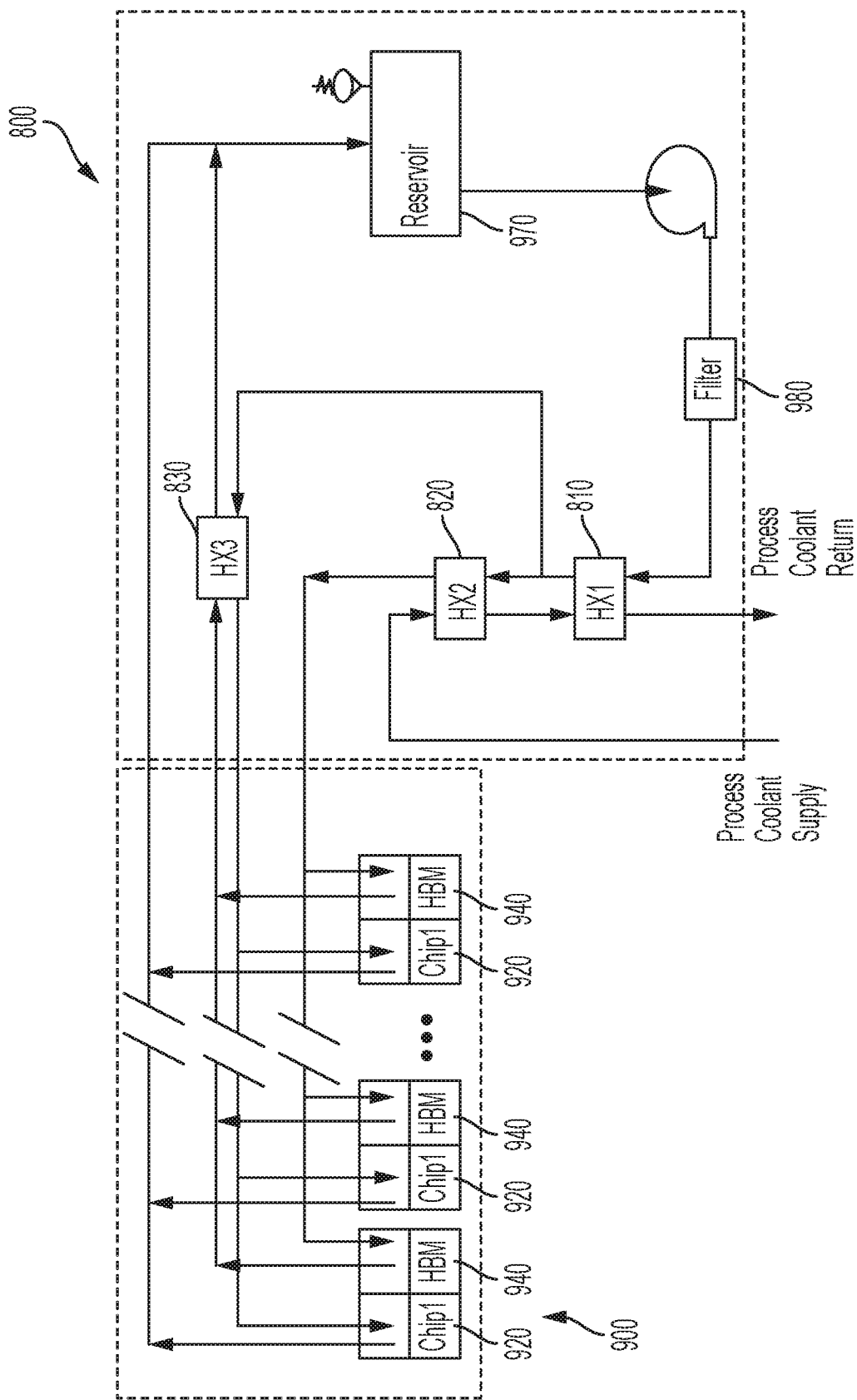
FIG. 9B is a schematic flow diagram of one example of a grouping of the fluid delivery system of FIG. 9A.
Figure 9C:
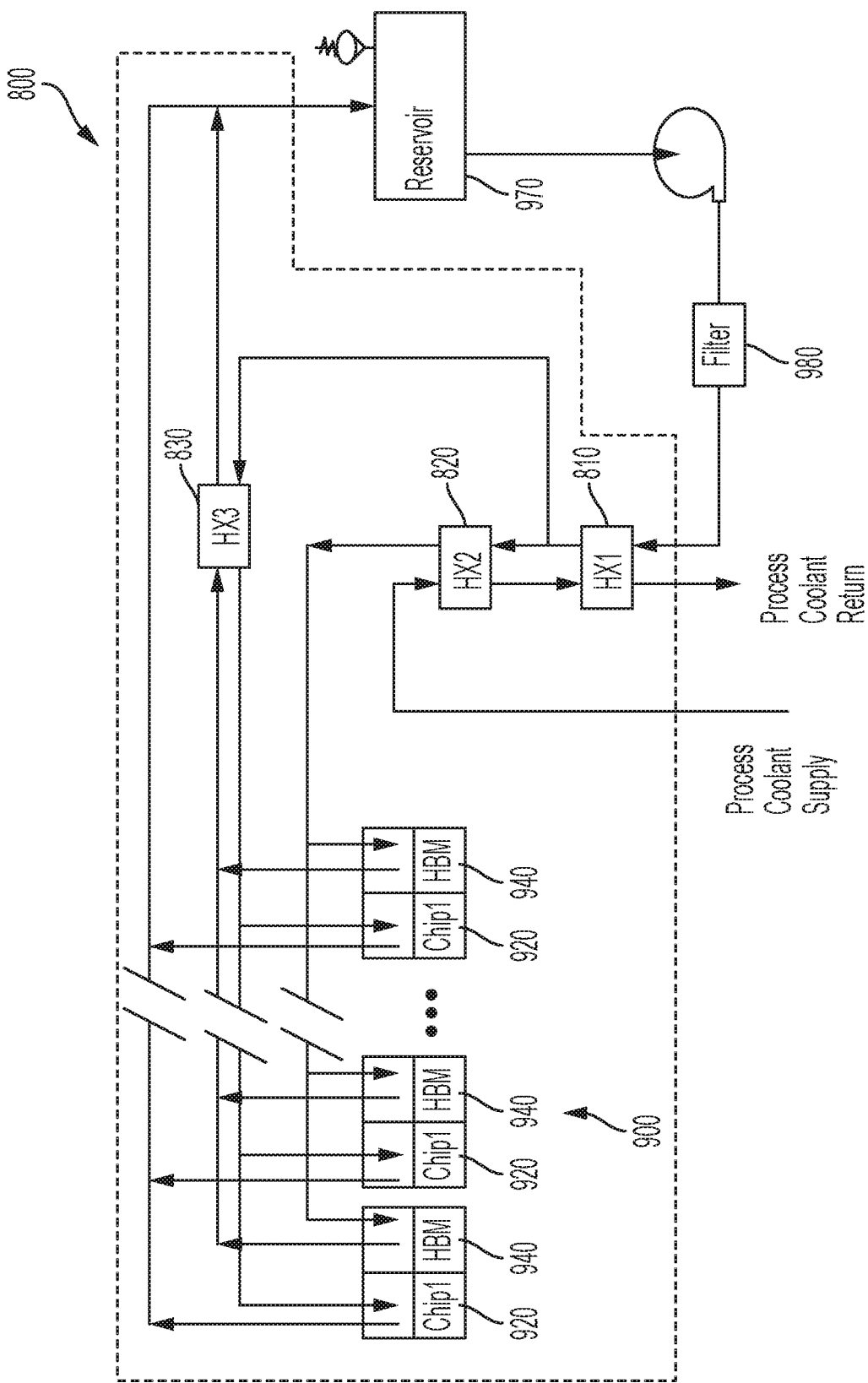
FIG. 9C is a schematic flow diagram of another example of a grouping of the fluid delivery system of FIG. 9A.

FIGS. 9B and 9C are schematic flow diagrams including example groupings of components of fluid delivery system 800. The groupings may enable use of a common pump, reservoir, and/or filter for a plurality of machines.

In the example of FIG. 9B, first chip component 920 and second chip component 940 are grouped together while all other components of system 800 are grouped together such as first, second and third heat exchangers 810, 820, 830 and reservoir 970 and filter 980. As the heat exchangers 810-830 are grouped with the pump, reservoir, and filter, they could support multiples of the other grouping, which in this example includes several instances of a plurality of jet manifolds. Such grouping may reduce hardware costs for heat exchangers. However, it may also result in reduced control of flow.

In the example of FIG. 9C, all of the components of system 800 are grouped together in a first group other than reservoir 970 and filter 980 which are grouped together in a second group. For example, several instances of the group including the heat exchangers 810-830 and the manifolds may use a common reservoir 970, filter 980, and pump. Such groupings can provide for a better ability to control and optimize the amount of process coolant required at the expense of more heat exchangers.

Figure 10:
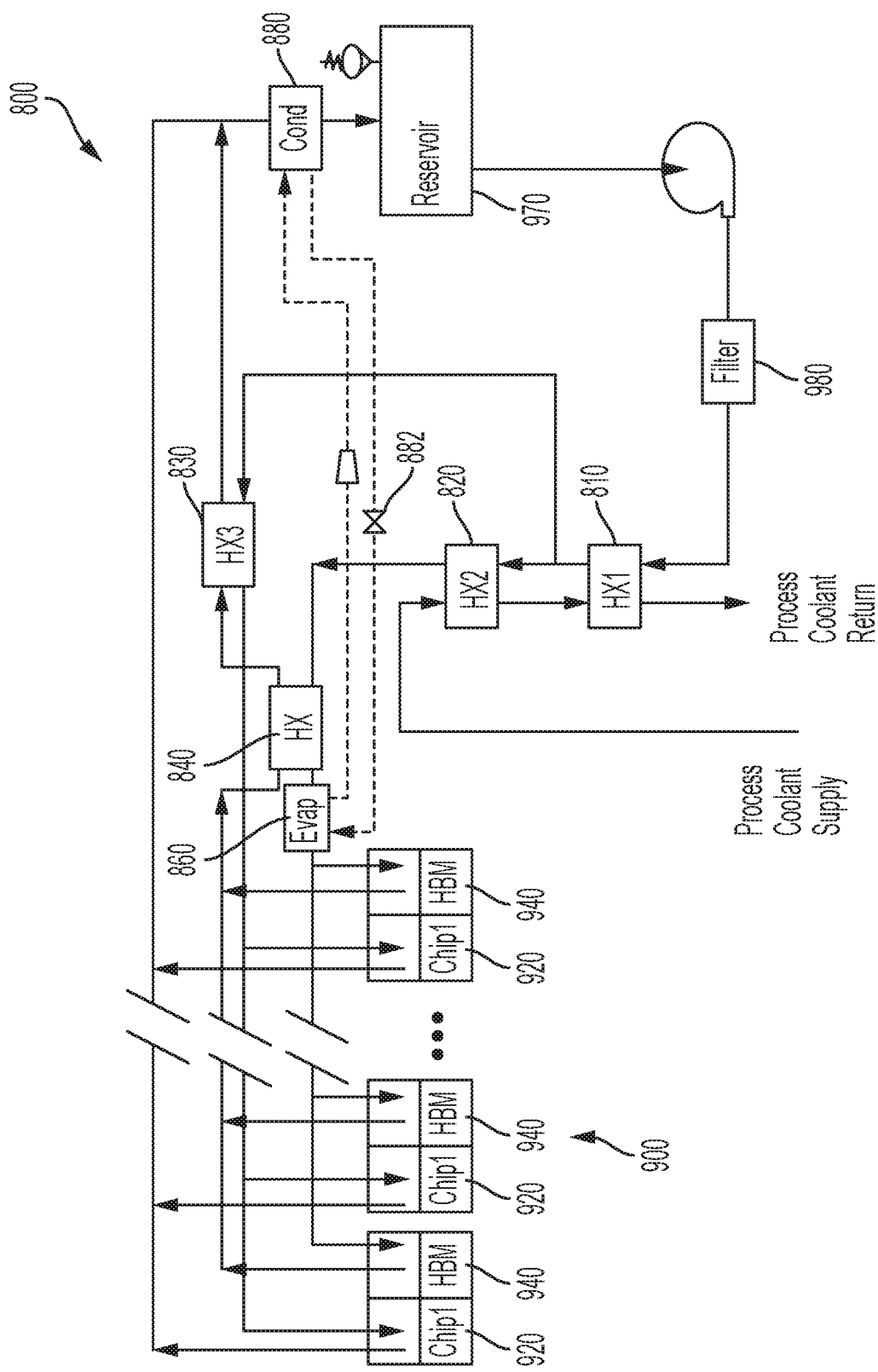
FIG. 10 is a schematic flow diagram of one example of an HBM chiller.

FIG. 10 is a schematic flow diagram of one example of an HBM chiller added to system 800. In this example, the HBM chiller is a refrigeration circuit which includes condenser 880, evaporator 860, and expansion valve 882. The HBM chiller removes heat and chills liquid that passes through the evaporator 860 and pumps that heat into the condenser 880. The HBM chiller may be implemented, for example, to sub cool the HBM only. The HBM portion can represent approximately 10-20% of the heat in some examples. Accordingly, cooling only the HBM portion requires much less chiller capacity than cooling all flow to that level. In this example, a fourth heat exchange 840 receives fluid exiting second heat exchange 820. The fourth heat exchange 840 also receives fluid that has exited from cooling one or more second chip components 940. Some of the fluid exiting the fourth heat exchange 840 does not flow directly to one or more second chip components 940 and instead enters into an evaporation chamber 860, the output of which flows to a condenser 880 and back to the evaporation chamber 860 in a cycle.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. An assembly, comprising:
   an orifice plate having top and bottom surfaces and a plurality of supply and return apertures, the plurality of supply apertures for receiving fluid flowing through the plate from the top surface to the bottom surface, the bottom surface of the orifice plate adapted to be sealed to a top surface of a substrate containing circuitry;
   a coolant delivery manifold having top and bottom surfaces and at least one supply cavity in fluid communication with at least a subset of the plurality of supply apertures, and at least one return cavity in fluid communication with the plurality of return apertures; and
   a first sealing member forming a hermetic seal between the top surface of the plate and the bottom surface of the manifold; wherein:
   the bottom surface of the coolant delivery manifold has an outer groove, the outer groove forming an outer closed perimeter adapted to receive at least a portion of the first sealing member therein; and
   the bottom surface of the manifold has an inner groove, the inner groove forming an inner closed perimeter at least partially surrounded by the outer closed perimeter and adapted to receive at least a portion of a second sealing member therein.

2. The assembly of claim 1, wherein when the top surface of the plate is sealed to the bottom surface of the coolant delivery manifold all of the plurality of supply and return apertures of the plate are contained within the outer closed perimeter of the outer groove of the coolant delivery manifold.

3. The assembly of claim 1, wherein when the top surface of the plate is sealed to the bottom surface of the manifold at least a subset of the plurality of supply and return apertures of the plate are contained within the inner closed perimeter of the inner groove of the manifold.

4. The assembly of claim 1, further comprising a plurality of return tubes directly connecting the at least one return cavity of the manifold with the plurality of return apertures of the plate.

5. The assembly of claim 1, further comprising a third sealing member adapted to create a hermetic seal between the bottom surface of the plate and to the top surface of the substrate.

6. The assembly of claim 5, wherein the bottom surface of the plate has a groove, the groove forming a closed outer perimeter adapted to receive at least a portion of the third sealing member therein.

7. The assembly of claim 6, wherein all of the plurality of supply and return apertures of the plate are located within the closed outer perimeter of the groove when the plate is sealed to the substrate.

8. A coolant delivery manifold, comprising:
   a top surface including at least one supply cavity and at least one return cavity; and
   a bottom surface including an inner cavity and a surrounding outer cavity,
   wherein each of the at least one supply cavities includes an opening between a bottom portion of the supply cavity and at least one of the inner cavity or the surrounding outer cavity on the bottom surface, the opening adapted for transmission of fluid at a first temperature through the supply cavity to the inner cavity and transmission of a fluid at a second temperature different than the first temperature to the surrounding outer cavity, and
   wherein the at least one return cavity includes a plurality of apertures between the inner cavity on the bottom surface and the top surface, the plurality of apertures sized to receive a plurality of fluid return tubes.

9. The coolant delivery manifold of claim 8, wherein the bottom surface of the manifold is adapted to be coupled to a top surface of an orifice plate, and wherein a bottom surface of the orifice plate is adapted to be sealed to a top surface of a substrate containing circuitry.

10. The coolant delivery manifold of claim 9, wherein the substrate has first and second circuitry regions, the first circuitry region corresponding to the inner cavity of the coolant delivery manifold, and the second circuitry region corresponding to the outer surrounding cavity of the coolant delivery manifold.

11. The coolant delivery manifold of claim 10, wherein the orifice plate includes a groove including a first closed perimeter and a second closed perimeter.

12. The coolant delivery manifold of claim 11, wherein when the orifice plate is sealed to the substrate at least a portion of the first circuitry region is located within the first closed perimeter of the groove and at least a portion of the second circuitry region is located within the second closed perimeter of the groove.

13. The coolant delivery manifold of claim 9, further comprising a sealing member forming a seal between the bottom surface of the manifold and the top surface of the orifice plate.

14. The coolant delivery manifold of claim 9, further comprising a plurality of return tubes directly connecting the at least one return cavity of the manifold with a plurality of return apertures in the orifice plate.

15. An assembly, comprising:
   an orifice plate having top and bottom surfaces, and a plurality of supply and return apertures, and a plurality of return tubes, each return aperture feeding into one of the return tubes, the bottom surface of the orifice plate adapted to seal to a top surface of a semiconductor containing circuitry, the plurality of supply and return apertures in fluid communication with the circuitry when the orifice plate and substrate are sealed together, and
   a gasket,
   a manifold having top and bottom surfaces, a first supply cavity in fluid communication with a first portion of the plurality of supply apertures, a second cavity in fluid communication with a second portion of the plurality of supply apertures, and at least one return cavity in fluid communication with the entirety of the plurality of return apertures through the return tubes; and a sealing member adapted to create a hermetic seal between the orifice plate and the manifold;

wherein the bottom surface of the orifice plate has at least one first cavity that is in fluid communication with the first portion of the plurality of supply apertures and some of the return apertures, the first cavity having an internal wall about a perimeter of the cavity, and a second cavity separated from the at least one first cavity by the gasket such that the gasket hermetically seals a first chip component of the circuitry from a second chip component of the circuitry when the bottom surface of the orifice plate is sealed to the top surface of the semiconductor at a position where the at least one first cavity extends over the first chip component and the second cavity extends over the second component, the second cavity being in fluid communication with the second portion of the plurality of supply apertures and some of the return apertures, and wherein at least some of the plurality of supply apertures are proximate the internal wall of the at least one cavity.

16. The assembly of claim 15, further comprising a second sealing member positioned about the perimeter of the at least one first cavity on the bottom surface of the plate.

17. The assembly of claim 16, wherein the second sealing member creates a seal between the orifice plate and the substrate, and the substrate includes one or more chips.

* * * * *